United States Patent
Yang et al.

[11] Patent Number: 6,087,262
[45] Date of Patent: Jul. 11, 2000

[54] METHOD FOR MANUFACTURING SHALLOW TRENCH ISOLATION STRUCTURE

[75] Inventors: Gwo-Shii Yang; Kuo-Tai Huang, both of Hsinchu; Tri-Rung Yew, Hsinchu Hsien; Water Lur, Taipei, all of Taiwan

[73] Assignee: United Microelectronics Corp., Hsinchu, Taiwan

[21] Appl. No.: 09/189,140

[22] Filed: Nov. 9, 1998

[51] Int. Cl.⁷ ...................................................... H01L 21/00
[52] U.S. Cl. ........................... 438/692; 438/745; 438/756
[58] Field of Search .................. 216/38, 80–88, 216/89, 99; 438/691, 692, 693, 719, 723, 724, 743, 744, 745, 753, 756, 757

[56] References Cited

U.S. PATENT DOCUMENTS

| | | | |
|---|---|---|---|
| 5,494,857 | 2/1996 | Cooperman et al. | 438/692 X |
| 5,721,172 | 2/1998 | Jang et al. | 216/38 X |

Primary Examiner—William Powell
Attorney, Agent, or Firm—Thomas, Kayden, Horstemeyer & Risley

[57] ABSTRACT

A method for manufacturing shallow trench isolation structure includes the steps of fabricating a self-aligned silicon nitride mask over the trench region so that a kink effect due to the misalignment of mask during a conventional mask-making process can be avoided. Moreover, the silicon nitride mask requires fewer steps and less complicated operations to construct than a conventional reverse tone mask.

15 Claims, 4 Drawing Sheets

METHOD FOR MANUFACTURING SHALLOW TRENCH ISOLATION STRUCTURE

BACKGROUND OF THE INVENTION

1. Field of Invention

The present invention relates to a method for manufacturing a shallow trench isolation structure. More particularly, the present invention relates to a method that utilizes a self-aligned mask for fabricating shallow trench isolation structure.

2. Description of Related Art

Chemical-mechanical polishing (CMP) is a global planarization technique for planarizing the surface of very-large scale integrated (VLSI) circuits or the more compact ultra-large scale integrated (ULSI) circuits. As the feature size of integrated circuits continues to decrease, CMP technique may become the only cost effective means of providing a planarized surface.

Size of semiconductor devices is constantly being reduced. Nowadays, semiconductor industry is fabricating deep sub-half micron devices having a line width of from 0.25 μm down to about 0.18 μm. The CMP technique has become an important surface planarization technique especially for planarizing the insulation layer within a shallow trench. However, dishing on the upper surface of a polished insulation layer may occur when the insulation layer is embedded within a wide trench area. Therefore, a reverse tone mask is sometimes formed over the insulation layer, and then the insulation layer is etched back to form an insulation layer having an undulating profile.

Subsequently, the reverse tone mask is removed and then the undulating insulation layer is polished using CMP technique to form a surface with a high degree of uniformity. However, should some misalignment of the reverse tone mask occur, a portion of the trench isolation structure may be etched away causing some structural damages.

FIGS. 1A through 1D are cross-sectional views showing the progression of manufacturing steps according to a conventional method for fabricating a shallow trench isolation structure using a reverse tone mask. First, as shown in FIG. 1A, a semiconductor substrate 10 is provided. Thereafter, a silicon nitride layer 12 is deposited over the substrate 10. Next, photolithographic and anisotropic etching operations of the silicon nitride layer 12 and the substrate 10 are carried out to form shallow trenches 14 between active regions 16.

In the subsequent step, as shown in FIG. 1B, an insulation layer, for example, a silicon dioxide layer, is deposited over the substrate and fills the shallow trenches 14, using a chemical vapor deposition (CVD) method. Since the substrate 10 has a highly undulating cross-sectional profile due to those trenches 14, the deposited silicon dioxide layer 18 has a rugged contour. In other words, the upper surface of the silicon dioxide layer 18 has a highly rugged cross-sectional profile, as well. Henceforth, a photoresist layer is deposited over the silicon dioxide layer 18, and then a photolithographic process is conducted to form a reverse tone mask 20. The reverse tone mask 20 is formed directly on top of the shallow trenches 14 just complementary to the active regions 16.

However, manufacturing errors may lead to a misalignment of the reverse tone mask 20, and hence the reverse tone mask may not cover the shallow trenches 14 entirely. Consequently, a portion of the silicon dioxide layer 18 may be exposed. When the silicon dioxide layer 18 is later etched, a portion of silicon dioxide layer 18 within the shallow trenches 14 will be removed forming recess cavities. These recess cavities may produce kink effect leading to short-circuiting or a leakage current. Furthermore, relying on a reverse tone mask to form a highly planar surface requires an additional mask-making operation, which will complicate the manufacturing process and increase the cost of forming the shallow trench isolation structure.

Next, as shown in FIG. 1C, the exposed silicon dioxide layer 18 is etched, and then the reverse tone mask 20 is removed. Therefore, grooves (unlabeled) are formed above the active regions 16 resulting in the formation of an undulating silicon dioxide layer 18a.

Finally, as shown in FIG. 1D, a portion of the silicon dioxide layer 18a that lies above the shallow trench 14 surface is removed using a chemical-mechanical polishing method. The polishing operation is conducted using the silicon nitride layer 12 as a polishing stop layer so that ultimately the upper surface of both the silicon nitride layer 12 and the insulation layer 18b are at the same level.

In light of the foregoing, there is a need to improve the method of fabricating shallow trench isolation structure.

SUMMARY OF THE INVENTION

Accordingly, the present invention provides a method for manufacturing shallow trench isolation structure that employs a self-aligned mask together with a chemical-mechanical polishing operation. The method can prevent the formation of recess cavities on the insulation layer embedded within a shallow trench, or the formation of micro-scratches in the insulation layer above the active regions. Both the recess cavities and micro-scratches are capable of generating the so-called kink effect and may lead to possible short-circuiting of the device.

To achieve these and other advantages and in accordance with the purpose of the invention, as embodied and broadly described herein, the invention provides a method for manufacturing shallow trench isolation structure. The method includes the steps of first providing a semiconductor substrate, and then depositing a silicon nitride layer over the substrate. Thereafter, photolithographic and etching processes are carried out to form shallow trenches and active regions. Next, conformal layers including an insulation layer, a mask layer and an oxide layer are deposited in sequence over the substrate. In the subsequent step, a chemical-mechanical polishing operation is conducted to removed a portion of the oxide layer exposing the mask layer in the active regions. Then, the mask layer within the active regions is removed by etching to expose the insulation layer. Next, using the mask layer above the shallow trenches as an etching stop layer, the oxide layer and a portion of the insulation layer are removed to expose the mask layer above the shallow trenches. Finally, the mask layer above the trenches is also removed, and then another chemical-mechanical polishing operation is again conducted to remove the insulation layer above the silicon nitride layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION OF THE PREFERRED EMBODIMENTS

Figure 1A:
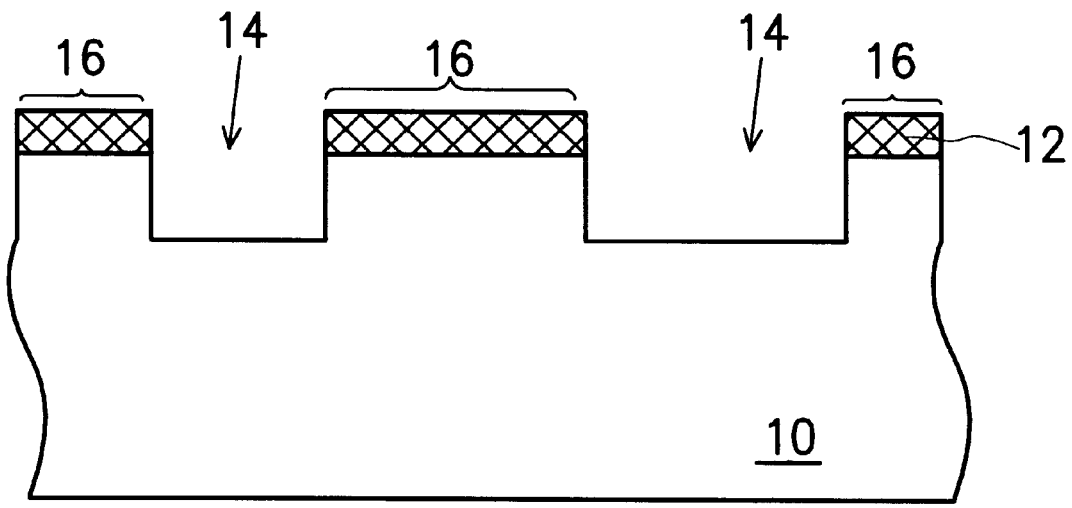
FIGS. 1A through 1D are schematic, cross-sectional views showing the progression of manufacturing steps according to a conventional method for fabricating a shallow trench isolation structure using a reverse tone mask.
Figure 1B:
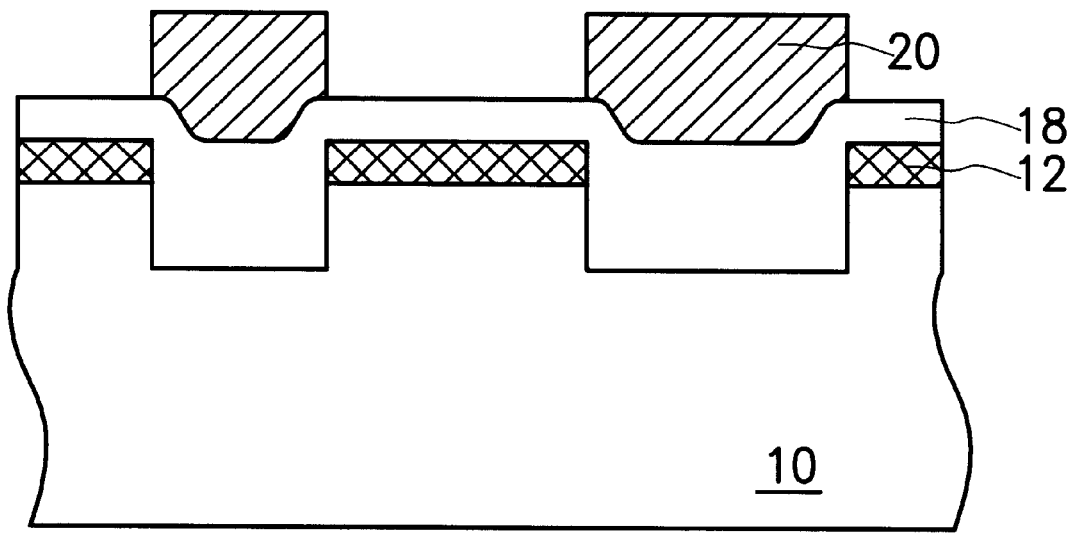
Figure 1C:
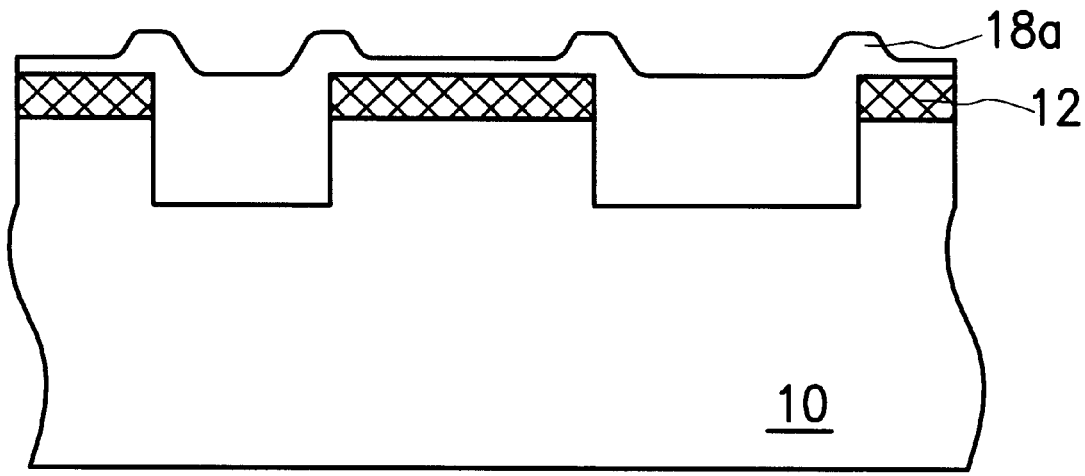
Figure 1D:
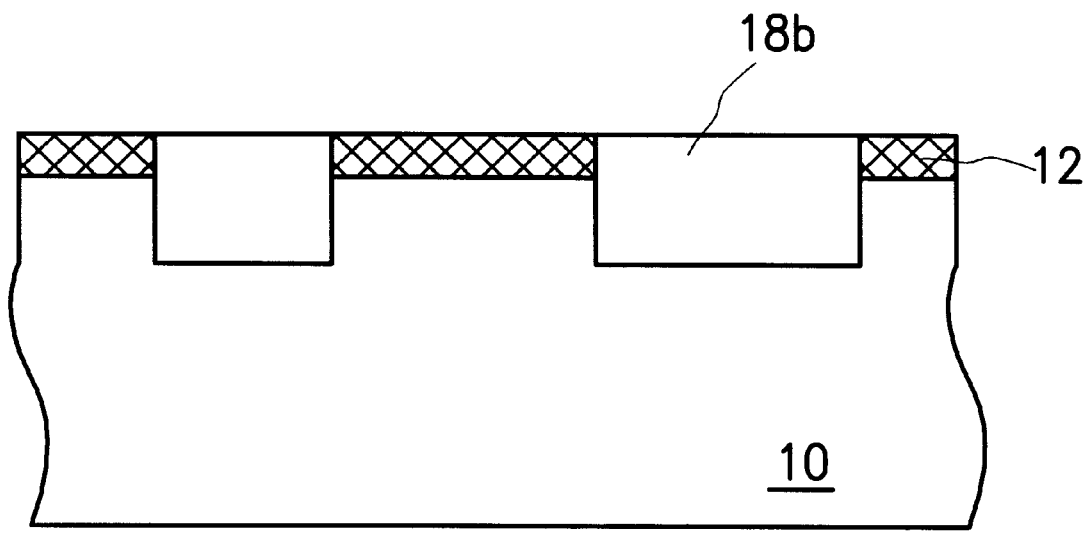

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing the progression of manufacturing steps for producing a shallow trench isolation structure using a self-aligned mask according to one preferred embodiment of this invention.

Figure 2A:
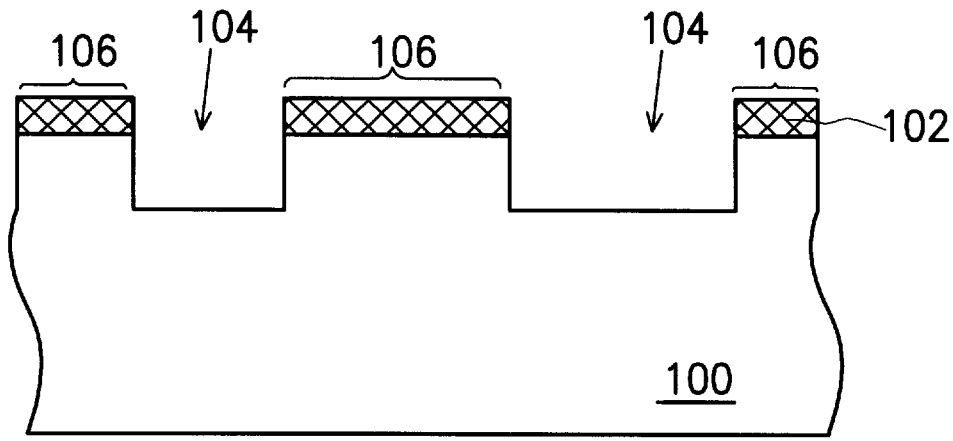
FIGS. 2A through 2E are schematic, cross-sectional views showing the progression of manufacturing steps for producing a shallow trench isolation structure using a self-aligned mask according to one preferred embodiment of this invention.

First, as shown in FIG. 2A, a semiconductor substrate 100 is provided. Thereafter, a silicon nitride layer 102 is deposited over the substrate 100. Next, photolithographic and anisotropic etching operations of the silicon nitride layer 102 and the substrate 100 are carried out to form shallow trenches 104 between active regions 106. Due to layout considerations, different active regions require different degree of isolation. Consequently, different shallow trenches 104 may have different dimensions.

Figure 2B:
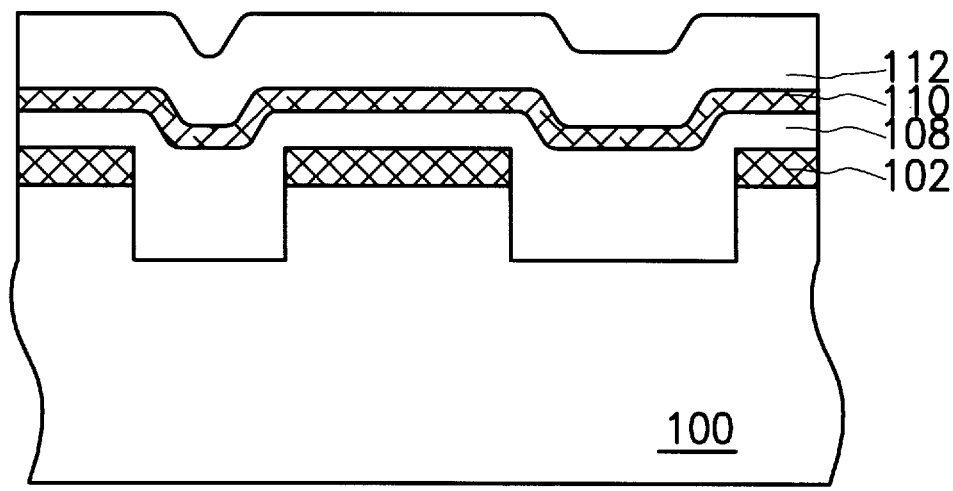

Next, as shown in FIG. 2B, an insulation layer 108, preferably a silicon dioxide layer, is formed over the substrate 100 using, for example, a chemical vapor deposition (CVD) method. The insulation layer not only covers the substrate 100, but also fills all the trenches 104. Since the substrate 100 had a highly undulating cross-sectional profile due to the presence of those trenches 104, the deposited silicon dioxide layer 108 over the substrate 100 also has a highly rugged contour. In other words, the upper surface of the silicon dioxide layer 108 has a rugged cross-sectional profile. Subsequently, a mask layer 110, preferably a silicon nitride layer, conformal to the surface of the insulation layer 108 is deposited. The mask layer 110 is slightly higher over the active regions 106 than over the shallow trench regions 104. After that, an oxide layer 112, preferably a silicon dioxide layer is deposited over the mask layer 110.

Figure 2C:
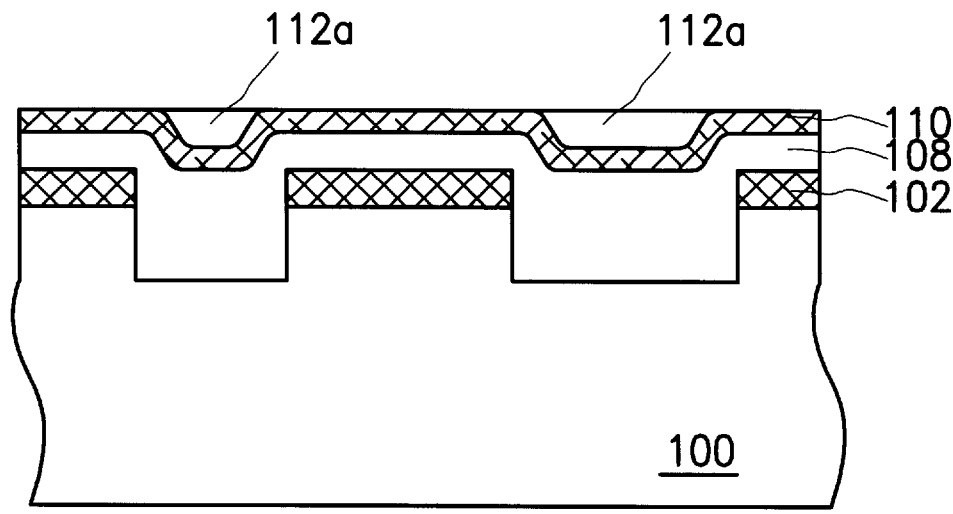

Next, as shown in FIG. 2C, using the mask layer 110 in the active region 106 as a polishing stop layer, a portion of the oxide layer 112 is removed using, for example, a chemical-mechanical polishing (CMP) method. Ultimately, the mask layer 112 within the active region 106 is exposed and a portion of the oxide layer 112 above the shallow trenches 104 is retained forming an oxide layer 112a. Since the mask layer 110 is harder than the oxide layer 112, the mask layer 110 above the active region 106 can protect the insulation layer 108 below. Hence, no micro-scratches are formed on the insulation layer in the active regions 106 after the CMP operation. Therefore, kink effect and the short-circuiting of devices can be prevented, thereby able to increase product yield.

Figure 2D:
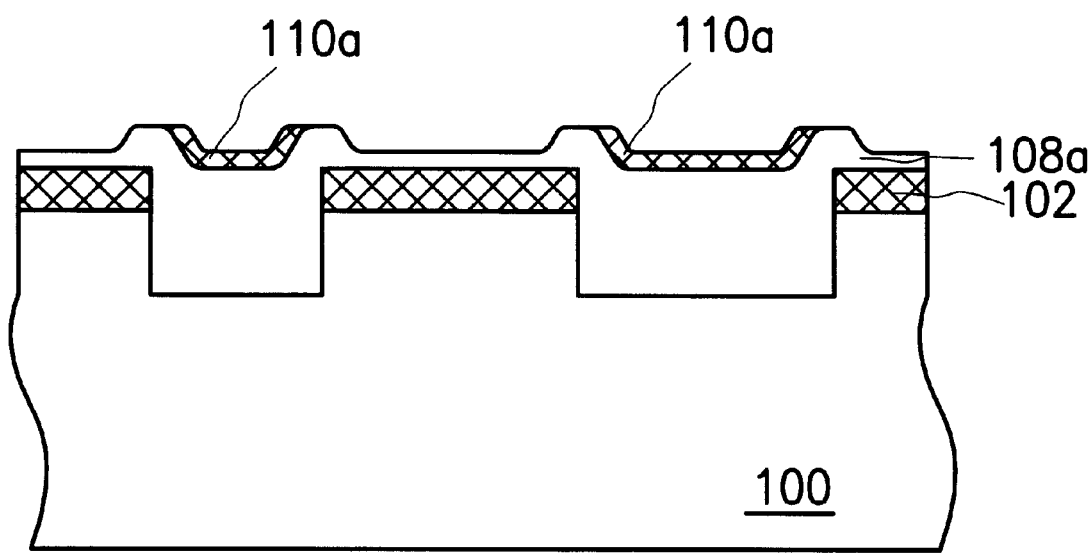

Next, the exposed mask layer 110 is removed using, for example, a wet etching or a dry etching method, thereby retaining a mask layer 110a above the shallow trenches 104 as shown in FIG. 2D. Thereafter, using the mask layer 110a as an etching stop layer, the oxide layer 112a and a portion of the insulation layer 108 is removed to expose the mask layer 110a. Hence, a mask layer 110a and an insulation layer 108a are formed. One major aspect of this invention is the provision of this self-aligned mask layer 110a by depositing mask material over the active regions 106 and the trench regions 104, which have different height levels. Since conventional method of forming a reverse tone mask using photoresist is replaced, problems caused by photomask misalignment can be prevented.

Figure 2E:
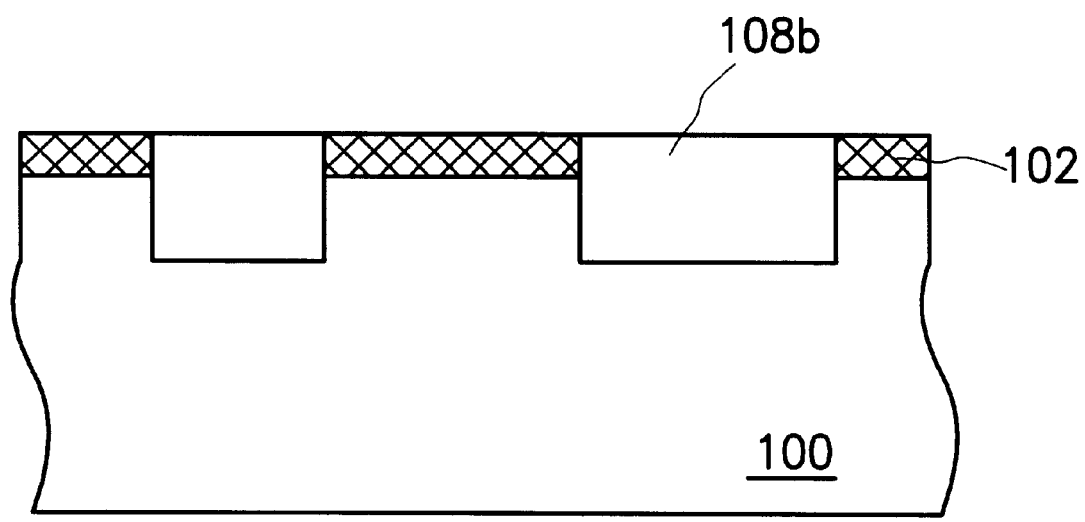

Finally, as shown in FIG. 2E, the mask layer 110a is removed to expose the insulation layer 108a using, for example, a wet etching or a dry etching method. Thereafter, a chemical-mechanical polishing (CMP) operation is again carried out to remove a portion of the insulation layer 108a above the silicon nitride layer 102, thereby forming an insulation layer 108b.

By replacing the conventional reverse tone mask by a silicon nitride (SiN) mask, this invention is able to reduce the polishing time required in a CMP operation while maintaining all the advantages of using a reverse tone mask. Because the polishing time is reduced, micro-scratches are formed not so readily. Furthermore, the silicon nitride mask layer can produce a self-aligning effect when the insulation layer is etched, and so conventional mask misalignment problems are eliminated. Hence, cost of production can be reduced and yield of device can be increased.

In summary, the advantages of using a self-aligned mask for manufacturing shallow trench isolation structure include:

1. The method can prevent a kink effect caused by mask misalignment in a conventional manufacturing process. Therefore, device short-circuiting is minimized and the yield can be increased.

2. By providing a self-aligned mask layer over the insulation layer, the method can prevent the formation of micro-scratches on the surface of an insulation layer above the active region when CMP operation is carried out. Therefore, the kink effect is prevented and failure of device due to short-circuit is minimized.

3. The method can reduce the polishing time of CMP operation considerably, hence production yield is higher and processing window for manufacturing the shallow trench structure is wider.

4. The method reduced the over-polishing time and hence the degree of polishing in the insulation layer. Therefore, the number of recess cavities and defects resulting from the CMP operation will be reduced.

5. Since the deposition of a reverse tone mask layer and a photolithographic operation is unnecessary, the process of forming the shallow trench isolation structure is simpler, which is good for lowering production cost.

it will be apparent to those skilled in the art that various modification and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing shallow trench isolation structure, comprising the steps of:

providing a substrate having a shallow trench and an active region thereon;

forming a silicon nitride layer over the active region of the substrate;

forming an insulation layer that fills the shallow trench and covers the silicon nitride layer;

forming a conformal mask layer over the insulation layer;

forming an oxide layer on the conformal mask layer;

polishing a portion of the oxide layer until the mask layer is exposed, wherein the mask layer serves as a polishing stop layer;

removing the mask layer in the active region to expose the insulation layer;

removing the oxide layer above the shallow trench and the insulation layer above the active region, thereby exposing the mask layer above the shallow trench;

removing the mask layer above the shallow trench; and removing the insulation layer to expose the silicon nitride layer.

2. The method of claim 1, wherein the step of forming the insulation layer includes growing a silicon dioxide layer.

3. The method of claim 1, wherein the step of forming the insulation layer includes using chemical vapor deposition.

4. The method of claim 1, wherein the step of forming the mask layer includes depositing silicon nitride to form a silicon nitride layer.

5. The method of claim 1, wherein the step of forming the oxide layer includes growing a silicon dioxide layer.

6. The method of claim 1, wherein step of removing the oxide layer above the active region includes using chemical-mechanical polishing.

7. The method of claim 1, wherein the step of removing the mask layer above the active region includes wet etching.

8. The method of claim 1, wherein the step of removing the mask layer above the active region includes dry etching.

9. The method of claim 1, wherein the steps of removing the oxide layer above the shallow trench and the insulation layer above the active region include wet etching.

10. The method of claim 1, wherein the step of removing the mask layer above the shallow trench includes wet etching.

11. The method of claim 1, wherein the step of removing the insulation layer includes using a chemical-mechanical polishing operation.

12. A method for forming a self-aligned mask used in the manufacturing of shallow trench isolation structure, comprising the steps of:

providing a substrate having a shallow trench and an active region thereon;

forming a silicon nitride layer over the active region of the substrate;

forming an insulation layer that fills the shallow trench and covers the silicon nitride layer;

forming a conformal mask layer over the insulation layer;

forming an oxide layer on the conformal mask layer;

polishing a portion of the oxide layer until the mask layer is exposed, wherein the mask layer serves as a polishing stop layer;

removing the mask layer in the active region to expose the insulation layer; and removing the oxide layer above the shallow trench and the insulation layer above the active region, thereby exposing the mask layer above the shallow trench.

13. The method of claim 12, wherein the step of forming the mask layer includes depositing silicon nitride to form a silicon nitride layer.

14. The method of claim 12, wherein the step of removing the mask layer above the active region includes wet etching.

15. The method of claim 12, wherein the step of removing the mask layer above the active region includes dry etching.

* * * * *